(12) United States Patent
Jeong et al.

(10) Patent No.: US 11,107,512 B2
(45) Date of Patent: Aug. 31, 2021

(54) MEMORY DEVICE AND MEMORY SYSTEM INCLUDING THE SAME

(71) Applicant: Samsung Electronics Co., Ltd., Suwon-si (KR)

(72) Inventors: Byunghoon Jeong, Hwaseong-si (KR); Kyungtae Kang, Seoul (KR); Jangwoo Lee, Seoul (KR); Jeongdon Ihm, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/001,941

(22) Filed: Aug. 25, 2020

(65) Prior Publication Data

US 2021/0104267 A1 Apr. 8, 2021

(30) Foreign Application Priority Data

Oct. 4, 2019 (KR) .................. 10-2019-0123349

(51) Int. Cl.
*G11C 7/22* (2006.01)
*G11C 7/04* (2006.01)
*G11C 7/10* (2006.01)

(52) U.S. Cl.
CPC ............ *G11C 7/222* (2013.01); *G11C 7/04* (2013.01); *G11C 7/1045* (2013.01); *G11C 7/1066* (2013.01); *G11C 7/1093* (2013.01)

(58) Field of Classification Search
CPC ..... G11C 7/222; G11C 7/1045; G11C 7/1066; G11C 7/10; G11C 7/1057
See application file for complete search history.

(56) References Cited

U.S. PATENT DOCUMENTS

| 6,691,214 | B1 | 2/2004 | Li et al. |
| 7,036,053 | B2 | 4/2006 | Zumkehr et al. |
| 7,246,022 | B2 | 7/2007 | McCall et al. |
| 8,605,539 | B2 | 12/2013 | Haldar et al. |
| 10,095,420 | B2 | 10/2018 | Yu et al. |
| 2002/0049872 | A1* | 4/2002 | Kamihara ............... G06F 5/06 710/71 |
| 2006/0227911 | A1 | 10/2006 | Millman et al. |
| 2012/0232716 | A1 | 9/2012 | Janzen et al. |
| 2016/0087918 | A1 | 3/2016 | Cheng et al. |
| 2017/0092339 | A1* | 3/2017 | Park ................... G11C 16/10 |
| 2019/0050159 | A1 | 2/2019 | Jung et al. |
| 2020/0372941 | A1* | 11/2020 | Park ..................... G11C 8/18 |

FOREIGN PATENT DOCUMENTS

KR 2019-0016870 A 2/2019

* cited by examiner

*Primary Examiner* — Han Yang
(74) *Attorney, Agent, or Firm* — Harness, Dickey & Pierce, P.L.C.

(57) ABSTRACT

A memory device includes a memory cell array configured to store data; and a data output circuit configured to transmit status data to an external device through at least one data line in a latency period in response to a read enable signal received from the external device and transmit the data read from the memory cell array to the external device through the at least one data line in a period subsequent to the latency period.

20 Claims, 19 Drawing Sheets

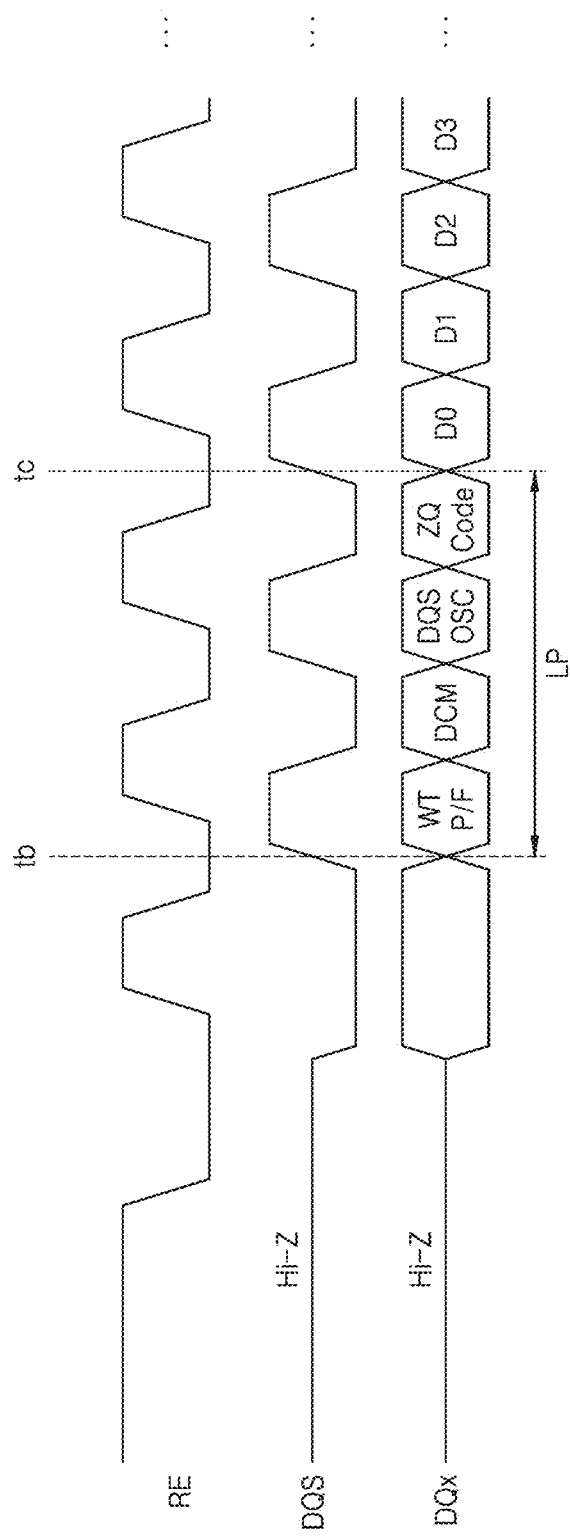

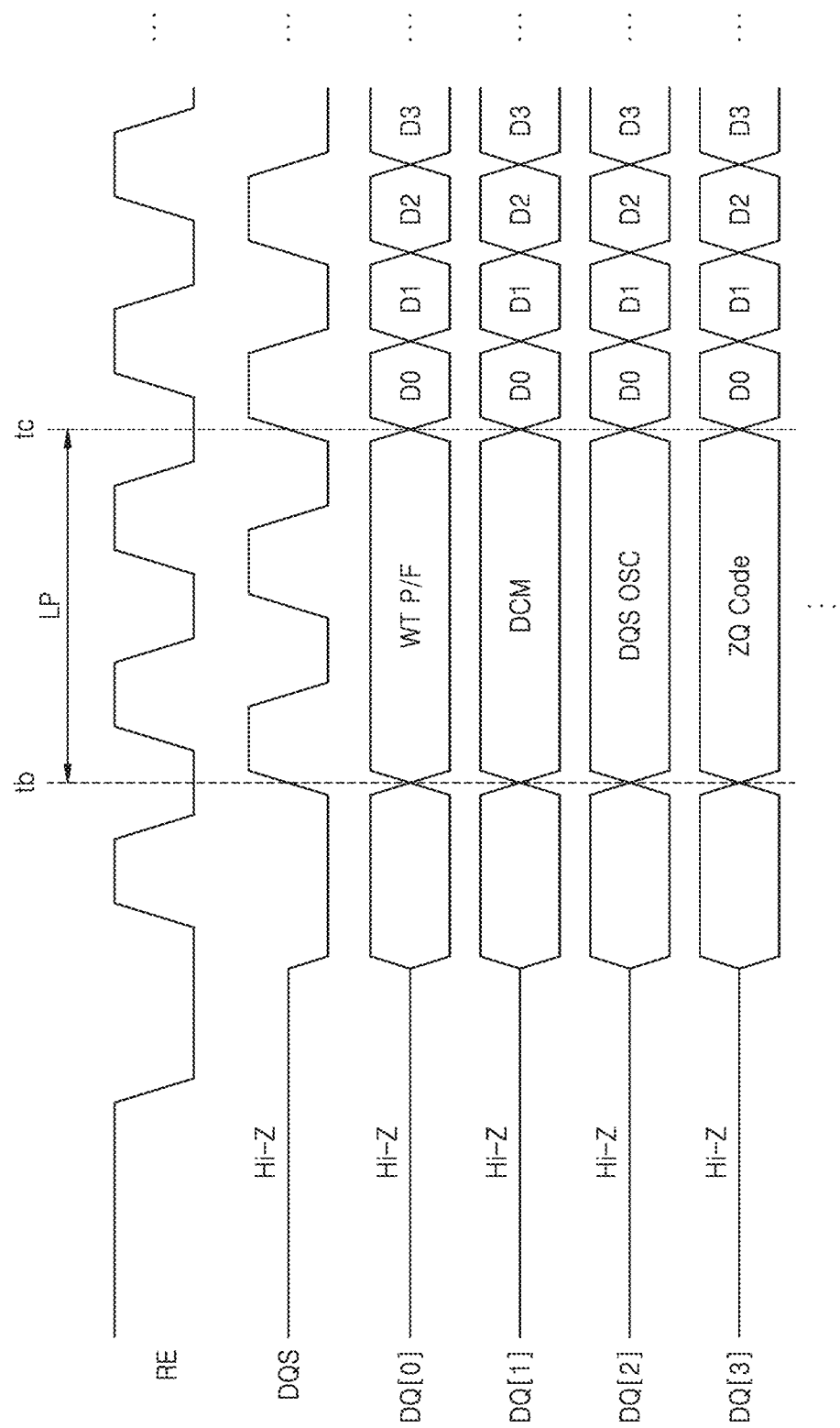

MEMORY DEVICE AND MEMORY SYSTEM INCLUDING THE SAME

CROSS-REFERENCE TO RELATED APPLICATION

This application claims the benefit of Korean Patent Application No. 10-2019-0123349, filed on Oct. 4, 2019, in the Korean Intellectual Property Office, the disclosure of which is incorporated herein in its entirety by reference.

BACKGROUND

Example embodiments of the inventive concepts relate to a memory device. For example, at least some example embodiments relate to a memory device that transmits data to a memory controller and/or a memory system including the memory device.

Memory devices may be generally classified into volatile memory devices such as dynamic random access memory (DRAM), static RAM (SRAM), etc. and nonvolatile memory devices such as electrically erasable programmable read-only memory (EEPROM), ferroelectrics RAM (FRAM), phase-change RAM (RRAM), magnetic RAM (MRAM), flash memory, etc. Nonvolatile memory preserves stored data even when power is cut off.

A memory controller connected to the memory device may perform a training operation on the memory device after power-on to meet a desired (or, alternatively, an optimal) alignment condition between data and a clock signal and control a memory operation such as a write operation, a read operation, etc. When a desired (or, alternatively, a predetermined) time passes after the training operation, a skew may occur between the data and the clock signal due to a change in a memory operating environment, and thus, failure may occur during the write operation or the read operation. The memory controller may perform a retraining operation on the memory device to account for the skew. However conventionally, it may be difficult for the memory device to efficiently transmit data (e.g., state data indicating a status of the memory device) to the memory controller for determining whether the memory controller should perform the retraining operation.

SUMMARY

Example embodiments of the inventive concepts provide a memory device that efficiently transmits data for determining whether to perform a retraining operation to a memory controller such that the retraining operation may be performed in a timely manner according to the status thereof, thereby improving memory performance, and a memory system including the memory device.

According to an example embodiments of the inventive concepts, there is provided a memory device including a memory cell array configured to store data; and a data output circuit configured to, transmit status data to an external device through at least one data line during a latency period in response to a read enable signal received from the external device, and transmit the data stored in the memory cell array to the external device through the at least one data line during a period subsequent to the latency period.

According to other example embodiments of the inventive concepts, there is provided a memory system including a memory controller; and a memory device configured to, transmit status data to the memory controller through a plurality of data lines during a latency period in response to a read enable signal received from the memory controller, and transmit data stored in the memory device to the memory controller through the plurality of data lines during a period subsequent to the latency period.

According to other example embodiments of the inventive concepts, there is provided a memory device including a memory cell array configured to store first data and second data; and a data output circuit configured to, transmit the first data to an external device at a first transmission rate through a plurality of data lines during a latency period in response to a read enable signal received from the external device, and transmit the second data to the external device at a second transmission rate through the plurality of data lines in a period subsequent to the latency period.

BRIEF DESCRIPTION OF THE DRAWINGS

Example embodiments of the inventive concepts will be more clearly understood from the following detailed description taken in conjunction with the accompanying drawings in which:

FIGS. 6A to 6C are timing diagrams illustrating a method performed by a memory device of transmitting status data according to example embodiments of the inventive concepts;

DETAILED DESCRIPTION

Hereinafter, an example embodiment of the inventive concepts will be described in detail with reference to the accompanying drawings.

Figure 1:
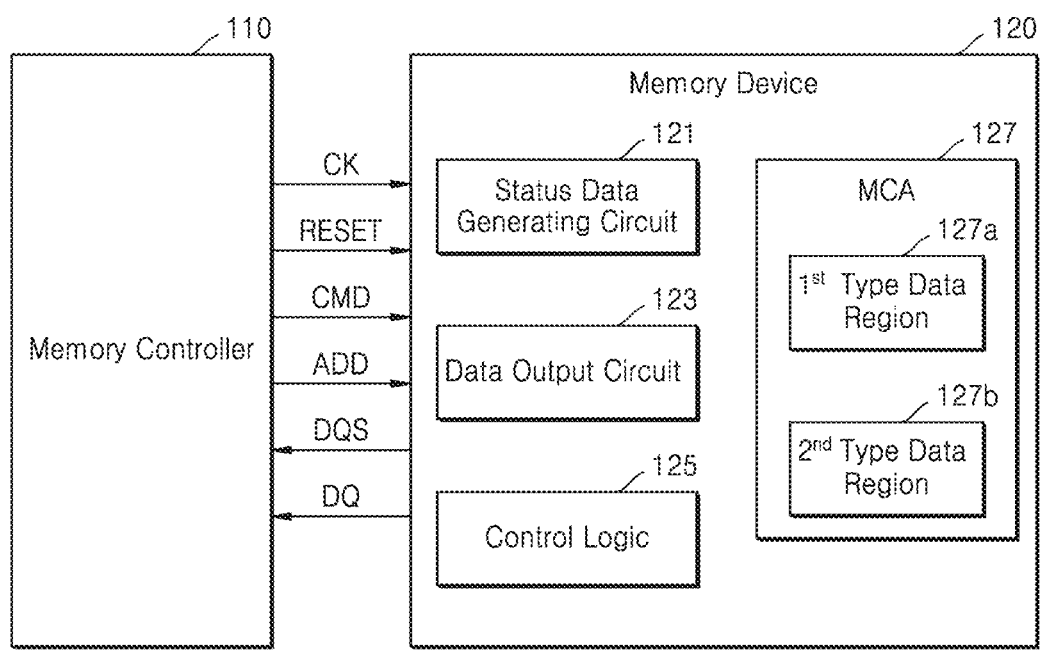
FIG. 1 is a block diagram illustrating a memory system according to an example embodiment of the inventive concepts.

FIG. 1 is a block diagram illustrating a memory system 100 according to an example embodiment of the inventive concepts.

Referring to FIG. 1, the memory system 100 may include a memory controller 110 and a memory device 120.

The memory device 120 may receive a clock signal CK, a reset signal RESET, a command CMD, and an address ADD from the memory controller 110. For example, the memory device 120 may be a flash memory as a nonvolatile memory device. In detail, the memory device 120 may include a NAND flash memory. The memory system 100 may be a storage device based on the flash memory and may be implemented as a memory card such as a solid state drive, a secure digital (SD) card or a multi media card (MMC). Furthermore, the memory system 100 may be implemented in a small size such as an embedded SSD (eSSD), an embedded MMC (eMMC), a universal flash storage (UFS), etc., and may be embedded in a portable electronic device. The eSSD may be used in laptop computers or e-books. The eMMC may be used in mobile devices, etc. However, the scope of the inventive concepts are not limited thereto. The memory device 120 may include a volatile memory such as DRAM, SRAM, etc., or a nonvolatile memory such as PRAM, RRAM, FRAM, etc. In some embodiments, the memory device 120 may be a three-dimensional memory device including a vertically stacked three-dimensional memory cell array (e.g., a VNAND memory cell array), and furthermore, a vertically stacked three-dimensional memory cell array of 100 or more stages may be applied to the memory device 120. In addition, core over periphery (CoP) technology may be applied to the memory device 120.

Meanwhile, the memory device 120 may perform a memory operation in various frequency domains, and in some embodiments, the memory device 120 may operate in a frequency domain of 1000 Mhz or more.

After the power of the memory system 100 is turned on, the memory controller 110 may transmit a reset signal RESET to the memory device 120. The memory device 120 may perform a reset operation by receiving the reset signal RESET. According to the reset operation, the memory device 120 may perform an initialization operation. Alternatively, the memory device 120 may receive an initialization command together with the reset signal RESET to perform the initialization operation. At this time, the transmission method of the status data of the memory device 120 to the memory controller 110 that will be described below may be set through a set feature operation between the memory device 120 and the memory controller 110.

The memory device 120 may perform an operation corresponding to the command CMD in response to the command CMD. For example, the command CMD may include a read command and a program command. The memory device 120 may perform a read operation and a program operation based on the address ADD.

The memory device 120 may output a data strobe signal DQS and a data signal DQ. According to an embodiment, the memory device 120 may be connected to the memory controller 110 through a data strobe line and a plurality of data lines, may transmit the data strobe signal DQS through the data strobe line, and may output the data signals DQ through the plurality of data lines, respectively. When the memory device 120 receives the read command from the memory controller 110, the memory device 120 may generate the data strobe signal DQS synchronized with a clock signal CK. The memory device 120 may transmit the data signal DQ including read data aligned with the data strobe signal DQS together with the data strobe signal DQS to the memory controller 110.

The memory device 120 according to an example embodiment of the inventive concepts may include a status data generation circuit 121, a data output circuit 123, a control logic 125, and a memory cell array (MCA) 127.

The status data generation circuit 121 may generate status data indicating the status of the memory device 120. The memory controller 110 may determine whether to perform a retraining operation on the memory device 120 based on the status data, and perform the retraining operation on the memory device 120. In some example embodiments, the memory controller 110 may transfer the status data received from the memory device 120 to a host, and the host may determine whether to perform the retraining operation based on the status data and control retraining on the memory device 120 through the memory controller 110.

In an example embodiment, the status data may include data for determining whether to perform the retraining operation on the memory device 120. For example, the status data generation circuit 121 may detect a degree of misalignment between the clock signal CK and the data signal DQ in the memory device 120 and generate the status data indicating whether to perform the retraining operation on the memory device 120. As another example, when the specific data promised by the memory device 120 and the memory controller 110 is written to the memory device 110, the status data generation circuit 121 may generate the status data indicating whether the specific data is properly written to the memory device 120.

In another example embodiment, the status data may include data indicating a degree of change in the temperature environment or the operating voltage environment of the memory device 120. The status data generation circuit 121 may generate status data that varies depending on the change in the temperature environment or the operating voltage environment of the memory device 120. Specifically, the status data may include read or write training result data (or input/output training result data), data about a duty cycle modulation of a signal (e.g., the data strobe signal DQS, the data signal DQ, etc.) of the memory device 120, data about oscillation of the data strobe signal DQS, memory core status data of the memory device 120, a ZQ code, etc. The data about the duty cycle modulation may indicate whether the duty cycle of the clock signal CK satisfying a target duty cycle according to the standard specification of the memory device 120 changes. The data about the oscillation of the data strobe signal DQS may indicate whether the number of signal toggles has changed in an oscillator outputting the data strobe signal DQS for a unit time through the path of the data strobe signal DQS or a duplicated path. The memory core status data may indicate a current status of the core of the memory device 120, and for example, may indicate whether the core of the memory device 120 is in an erase operation state, a write operation state, a read operation state, etc. The ZQ code may be for adjusting the gain (or strength) of an input/output driver. However, this is only an example embodiment, and the inventive concepts are not limited thereto. The status data may include various data for determining the retraining operation other than metadata or user data used for the read operation, the write operation, an erase operation, etc.

The MCA 127 may include a first type data region 127a and a second type data region 127b. In an example embodiment, the status data of the memory device 120 may be stored in the first type data region 127a, and the user data may be stored in the second type data region 127b.

The data output circuit 123 according to example embodiment may output the status data and the user data stored in the MCA 127 to the memory controller 110 as the data signal DQ through the plurality of data lines. The data output circuit 123 may output the status data read from the first type data region 127a within a desired (or, alternatively, predetermined) latency period before outputting the data read from the second type data region 127b in response to a read command from the memory controller 110. The latency period, which is a period set according to a latency cycle before the memory device 120 transmits the read data to the memory controller 110, may correspond to a period in which an initial data strobe signal is transmitted in the case where the data strobe signal DQS does not meet the target duty rate. The number of cycles of the initial data strobe signal in the latency period may be defined as a latency cycle. The memory device 120 may be in a status for preparing transmission of the read data until the end of the latency period or may perform a predefined memory operation (e.g., a duty cycle correction operation on the signal of the memory device 120) during the latency period.

The data output circuit 123 may output the status data through at least one data line within the latency period before outputting the read data to the memory controller 110 in response to the read command from the memory controller 110. The memory controller 110 may determine whether to perform a retraining operation on the memory device 120 based on the status data received in the latency period.

In addition, the memory device 120 and the memory controller 110 may previously determine the transmission method of the status data in the latency period through set feature information, and the memory controller 110 may confirm the status data received from the memory device 120 based on the set feature information. The set feature information includes information required to determine communication between the memory controller 110 and the memory device 120 and may be defined to comply with a standard. The set feature information may be set through a set feature operation between the memory controller 110 and the memory device 120 and may include information about the latency cycle and the transmission method of the status data.

For example, the transmission method of the status data may be determined according to the length of the latency cycle. The transmission method of the status data may include at least one of a transmission start timing of the status data in the latency period, a transmission rate of the status data, and a data type included in the status data. The details of the transmission method of the status data will be described later.

The control logic 125 may control the memory operation of the memory device 120 based on the command CMD and control a status data generation operation of the status data generation circuit 121 and a status data output operation of the data output circuit 123.

As described above, the memory device 120 according to an example embodiment of the inventive concepts may use the latency period to transmit the status data to the memory controller 110, thereby effectively providing the status data to the memory controller 110 without a separate command and a separate section. Accordingly, the memory controller 110 may determine whether to perform the retraining operation on the memory device 120 based on the status data, thereby managing the memory device 120 and improving the performance of the memory system 100 overall.

Figure 2:
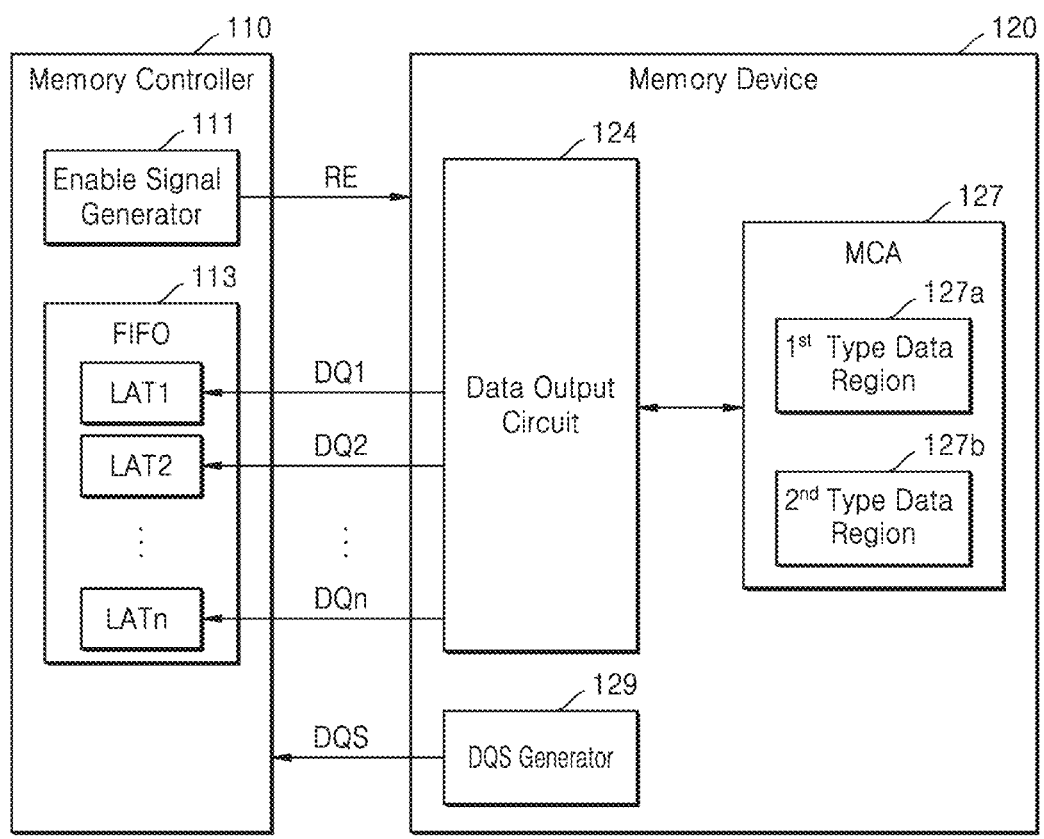
FIG. 2 is a block diagram of a memory system for describing a method of transmitting status data according to an example embodiment of the inventive concepts.

FIG. 2 is a block diagram of the memory system 100 for describing a method of transmitting status data according to an example embodiment of the inventive concepts. Hereinafter, redundant descriptions between FIGS. 1 and 2 are omitted.

Referring to FIG. 2, the memory controller 110 and the memory device 120 may be connected to each other through a data strobe line and a plurality of data lines. The memory controller 110 may include an enable signal generator 111 and a first-in first-out (FIFO) circuit 113. The enable signal generator 111 may provide a read enable signal RE to the memory device 120. The read enable signal RE may be used for a memory operation of the memory device 120 and may be toggled in a memory operation period of the memory device 120.

The memory device 120 may include a data output circuit 124, the MCA 127, and a DQS generator 129. The DQS generator 129 may generate the data strobe signal DQS in response to the read enable signal RE. The DQS generator 129 may transmit the data strobe signal DQS to the memory controller 110 through the data strobe line.

The data output circuit 124 according to an example embodiment of the inventive concepts may transmit the status data read from the first type data region 127a of the MCA 127 to the memory controller 110 through at least one data line in a latency period that is from an initial transition time of the data strobe signal DQS to a time when a predetermined latency cycle is satisfied in response to the read enable signal RE. For example, the data output circuit 124 may transmit data signals DQ1 to DQn including the status data to the memory controller 110 through the plurality of data lines. Various example embodiments in which the status data is transmitted will be described later. The data output circuit 124 may transmit the data signals DQ1 to DQn including data read from the second type data region 127b of the MCA 127 to the memory controller 110 in a period subsequent to the latency period through the plurality of data lines. The data signals DQ1 to DQn may be output by being aligned with a rising edge or a falling edge of the data strobe signal DQS. The data signals DQ1 to DQn output from the memory device 120 may be sequentially stored in latch circuits LAT1 to LAT8 of the FIFO circuit 113. The memory controller 110 may obtain the status data and the read data from data signals from the stored data signals DQ1 to DQn. The memory controller 110 may quickly determine whether to perform a retraining operation on the memory device 120 based on the obtained status data.

Figure 3:
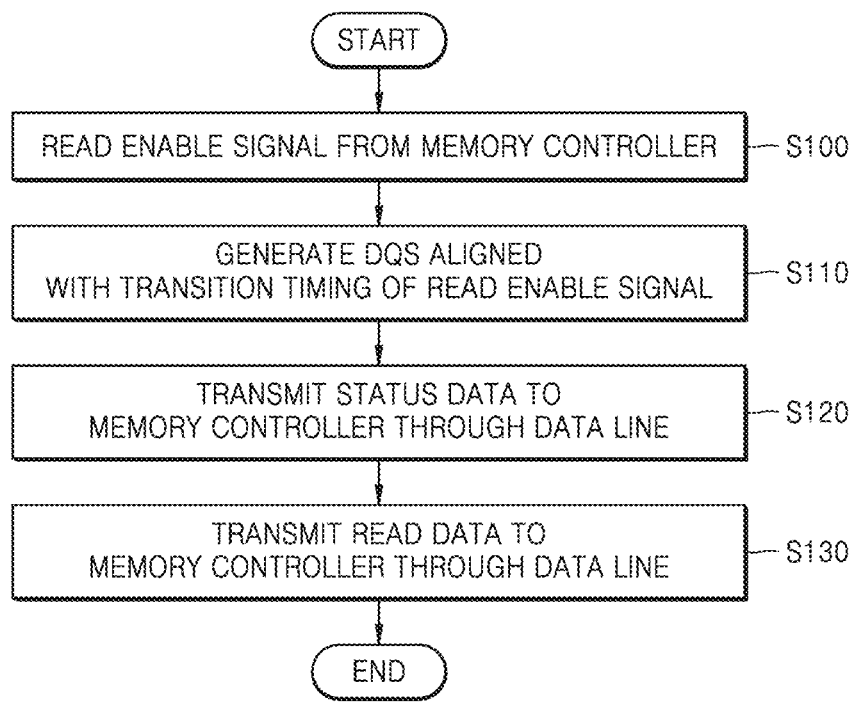
FIG. 3 is a flowchart illustrating a method performed by a memory device of transmitting status data, according to an example embodiment of the inventive concepts.

FIG. 3 is a flowchart illustrating a method, performed by a memory device, of transmitting status data, according to an example embodiment of the inventive concepts.

Referring to FIG. 3, in operation S100, the memory device 120 may receive the read enable signal RE together with a read command from a memory controller 110.

In operation S110, the memory device 120 may generate and provide the data strobe signal DQS aligned with a transition timing of the read enable signal RE to the memory controller 110.

In operation S120, the memory device 120 may transmit the status data to the memory controller 110 through at least one data line based on a desired (or, alternatively, predetermined) transmission method in a latency period that is from an initial transition time of the data strobe signal DQS to a time when a desired (or, alternatively, predetermined) latency cycle is satisfied in response to the read enable signal RE.

In operation S130, the memory device 120 may transmit read data DQ to the memory controller 110 in a period subsequent to the latency period through at least one data line.

Figure 4:
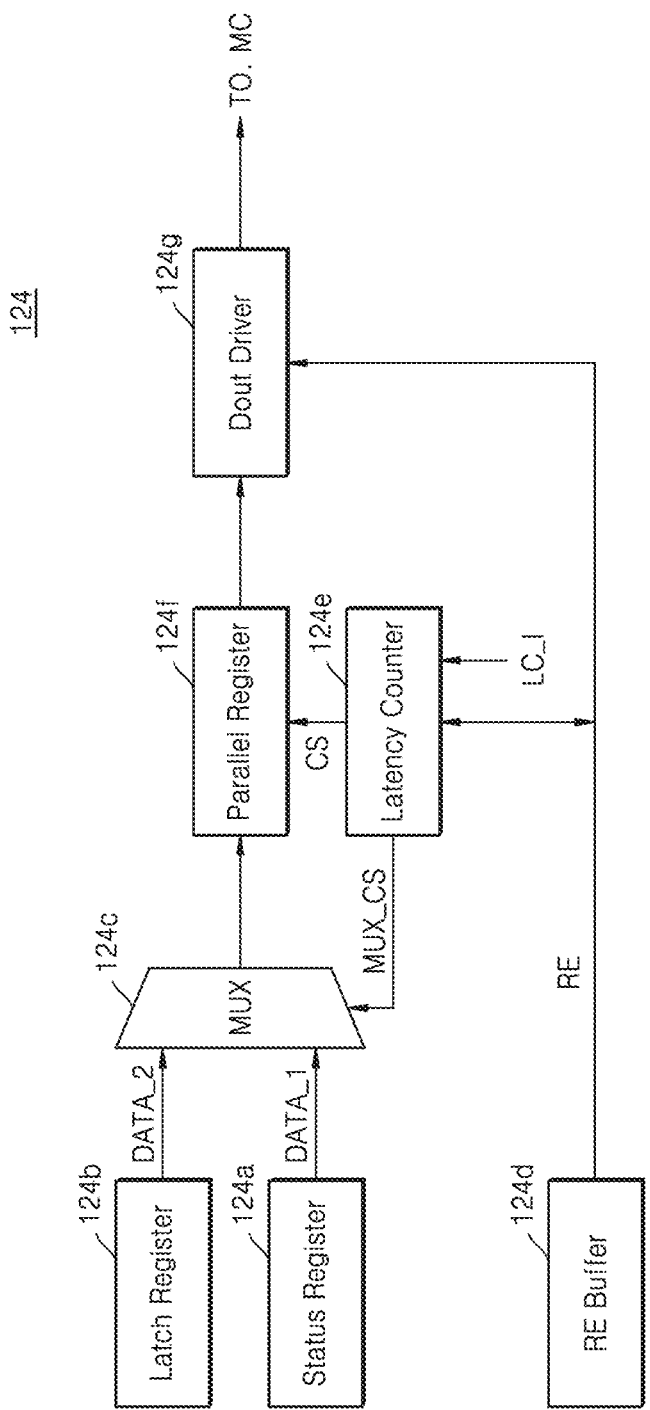
FIG. 4 is a block diagram illustrating an implementation example of a data output circuit according to an example embodiment of the inventive concepts.

FIG. 4 is a block diagram illustrating an implementation example of the data output circuit 124 according to an example embodiment of the inventive concepts. However, the implementation example illustrated in FIG. 4 is merely an example, and thus the configuration of the data output circuit 124 is not limited thereto.

Referring to FIG. 4, the data output circuit 124 may include a status register 124a, a latch register 124b, a multiplexer 124c, a read enable signal buffer 124d, a latency counter 124e, a parallel register 124f, and a data output driver 124g. The status register 124a may receive status data DATA_1 from a memory cell array of a memory device and sequentially store the status data DATA_1. The latch register 124b may receive read data DATA_2 from the memory cell array of the memory device and sequentially store the received read data. The output of each of the status register 124a and the latch register 124b may be coupled to the multiplexer 124c. The read enable signal buffer 124d may buffer and provide the read enable signal RE to the latency counter 124e and the data output driver 124g.

The latency counter 124e may further receive latency cycle information LC_I, which may indicate the length of a desired (or, alternatively, a predetermined) latency cycle. The latency counter 124e may provide a control signal MUX_CS to the multiplexer 124c in order to output the status data DATA_1 received from the status register 124a in the latency period based on the read enable signal RE and the latency cycle information LC_I to the parallel register 124f. In addition, the latency counter 124e may provide the control signal MUX_CS to the multiplexer 124c in order to output the read data DATA_2 received from the latch register 124b in a period subsequent to the latency period based on the read enable signal RE and the latency cycle information LC_I to the parallel register 124f.

The parallel register 124f may align and provide the received status data DATA_1 or read data DATA_2 with a data strobe signal based on a count result signal CS received from the latency counter 124e to the data output driver 124g. The data output driver 124g may output data signals including the status data DATA_1 or the read data DATA_2 to a memory controller MC 100 through a plurality of data lines.

Figure 5:
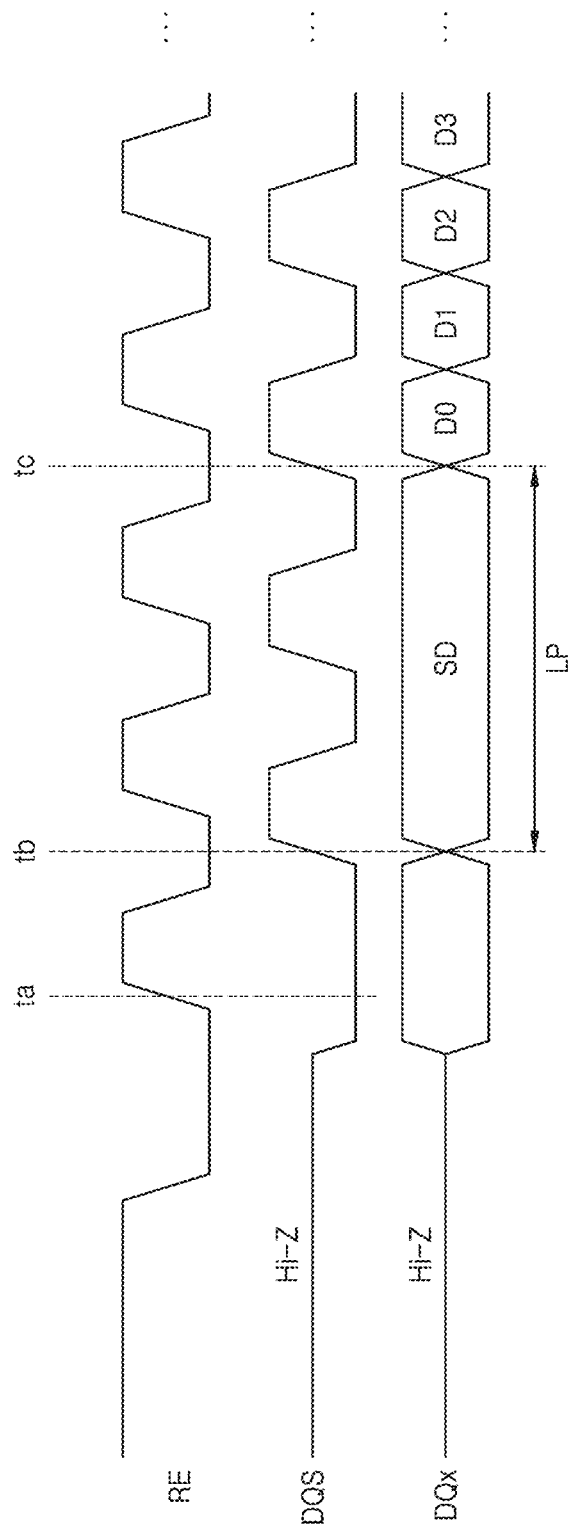
FIG. 5 is a timing diagram for describing an operation of a memory device according to an example embodiment of the inventive concepts.

FIG. 5 is a timing diagram for describing an operation of a memory device according to an example embodiment of the inventive concepts.

Referring to FIG. 5, when the memory device 120 receives the read enable signal RE at which a level changes at a first time ta, the memory device 120 may generate the data strobe signal DQS synchronized with the read enable signal RE and the level of the data strobe signal DQS may change at a second time tb. In FIG. 5, assuming that a latency cycle is 2, a period between the second time tb and a third time tc may be defined as a latency period LP. The data strobe signal DQS in the latency period LP may be referred to as an initial data strobe signal, and the number of cycles of the initial data strobe signal in the latency period LP may be two times. The memory device 120 may transmit a data signal DQx including status data SD to the memory controller 110 in the latency period LP. Thereafter, the memory device may transmit the data signal DQx including read data D0 to D3 to the memory controller in a period subsequent to the latency period LP.

FIG. 5 is only an example embodiment and is not limited thereto. In example embodiments, the length of the latency period LP may vary according to the latency cycle, which may not be 2, and a transmission method of the status data SD may vary according to the latency cycle. As described above, the latency cycle and the transmission method of the status data SD may be set (or, alternatively, preset) as set feature information.

Figure 6C:
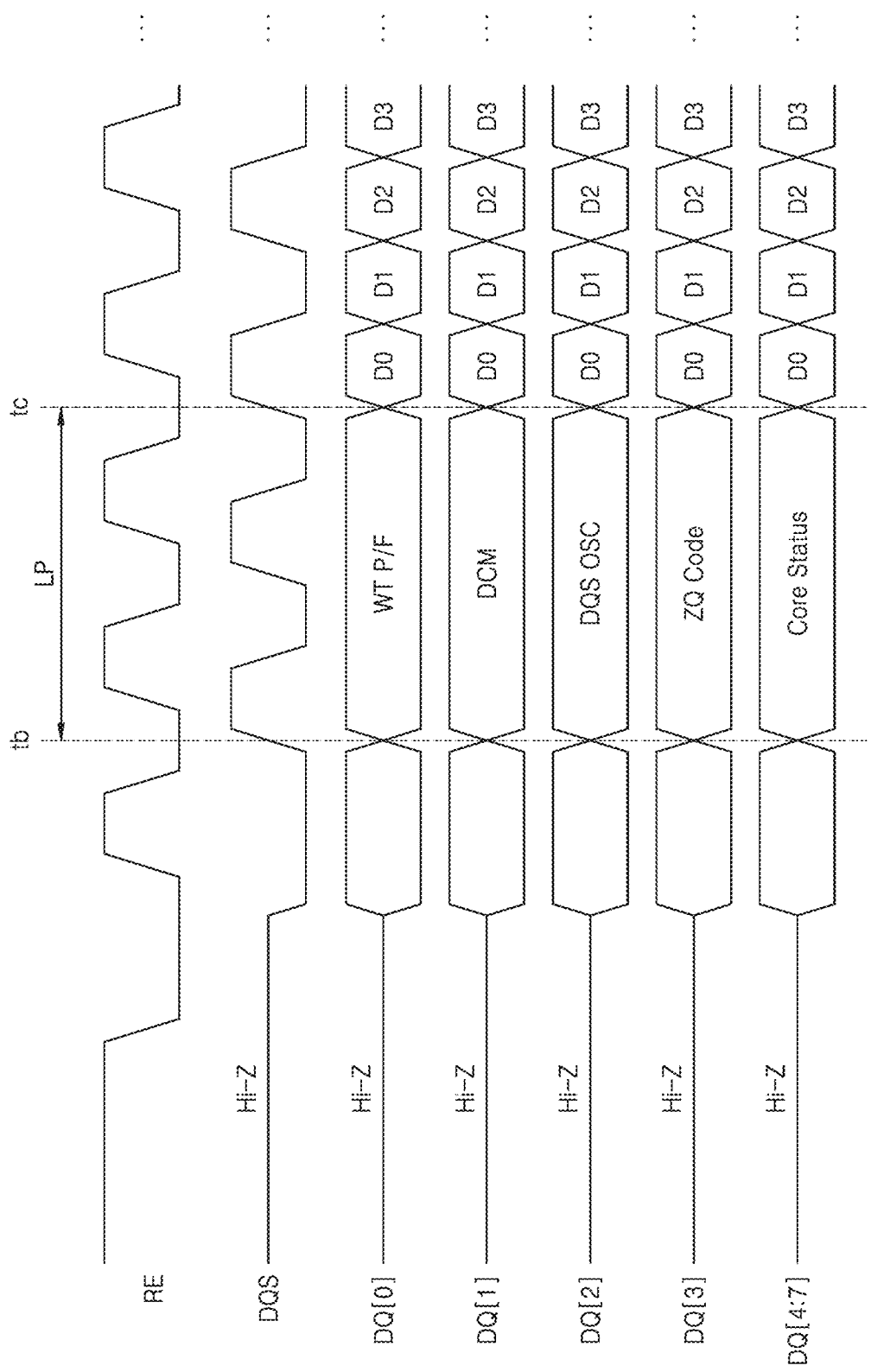

FIGS. 6A to 6C are timing diagrams illustrating a method performed by a memory device of transmitting status data according to example embodiments of the inventive concepts. Hereinafter, redundant descriptions between FIGS. 5 and 6A to 6C are omitted. The configuration of the status data illustrated in FIGS. 6A to 6C is merely an example embodiment and is not limited thereto. The configuration of the status data may be variously implemented to include data for determining whether to perform a retraining operation on the memory device.

Referring to FIG. 6A, the memory device 120 may transmit the data signals DQx including the status data in which various types of data are continuous in the latency period LP between the second time tb and the third time tc to the memory controller 110 through a data line. In an example embodiment, the status data may include write training result data WT P/F, data DCM about a duty cycle modulation of a signal of the memory device, data DQS OSC about oscillation of the data strobe signal DQS, and a ZQ code. In addition, the memory device may transmit the status data in the latency period LP and the read data D1 to D3 in a period subsequent to the latency period LP to the memory controller 110 at the same or similar transmission rate. However, this is only an example embodiment, and the inventive concepts are not limited thereto. The memory device 120 may transmit status data in which more or less types of data are continuous according to the length of the latency period LP to the memory controller.

Referring to FIG. 6B, the memory device 120 may transmit different types of status data to the memory controller 110 according to data lines in the latency period LP. In an example embodiment, the memory device 120 may transmit a first data signal DQ[0] including the write training result data WT P/F, a second data signal DQ[1] including the data DCM about the duty cycle modulation of the signal of the memory device 120, a third data signal DQ[2] including the data DQS OSC about oscillation of the data strobe signal DQS, and a fourth data signal DQ[3] including the ZQ code in the latency period LP. In addition, the memory device 120 may transmit the status data in the latency period LP and the read data D1 to D3 in the period subsequent to the latency period LP to the memory controller 110 at different transmission rates. Specifically, the transmission rate of the status data in the latency period LP may be lower than the transmission rate of the read data D0 to D3 in the subsequent period. That is, because there is a possibility that the data strobe signal DQS in the latency period LP does not meet a target duty ratio, the memory device 120 may lower the transmission rate of the status data to be less than the transmission rate of the read data D0 to D3 such that the memory controller 110 may obtain relatively accurate status data. For example, in the latency period LP, the memory device 120 may transmit the status data to the memory controller in a first frequency domain, and in the subsequent period, transmit the read data D0 to D3 to the memory controller in a second frequency domain. The second frequency domain may be an integer multiple of the frequency of the first frequency domain, for example, the second frequency domain may be twice the frequency of the first frequency domain.

The memory device 120 may operate at a single data rate (SDR) or a double data rate (DDR). In an example embodiment, the memory device may operate at the SDR in the latency period LP and may operate at the DDR in the subsequent period.

In another example embodiment, the memory device 120 may transmit data (e.g., user data) other than the status data to the memory controller 110 in the latency period LP. Because the data strobe signal DQS transmitted in the latency period LP is somewhat unstable, the memory device 120 may lower the transmission rate of data transmitted in the latency period LP to be less than that of the read data D0 to D3. Because the memory device transmits the data at a lower transmission speed than the read data D0 to D3 in the latency period LP, the memory controller 110 may sample and obtain other data at a lower frequency than the read data D0 to D3. As described above, the memory device 120 may lower the transmission rate of the data transmitted in the latency period LP so as to compensate for the somewhat unstable data strobe signal DQS in the latency period LP, and the memory controller 110 may relatively accurately obtain the data transmitted in the latency period LP.

Referring further to FIG. 6C, the memory device 120 may transmit fifth to eighth data signals DQ[4:7] including memory core status data Core Status to the memory controller 110 in the latency period LP. In comparison with FIG. 6B, the memory device 120 may transmit the same type of memory core status data Core Status to the memory controller 110 through a plurality of data lines. However, this is only an example embodiment, and the inventive concepts are not limited thereto. The memory device 120 may transmit some types of status data to the memory controller 110 through the plurality of data lines and transmit other types of status data to the memory controller 110 through one data line. As described above, the memory controller 110 may confirm the type of status data transmitted by the memory device 120 according to data lines with reference to set feature information.

Figure 7:
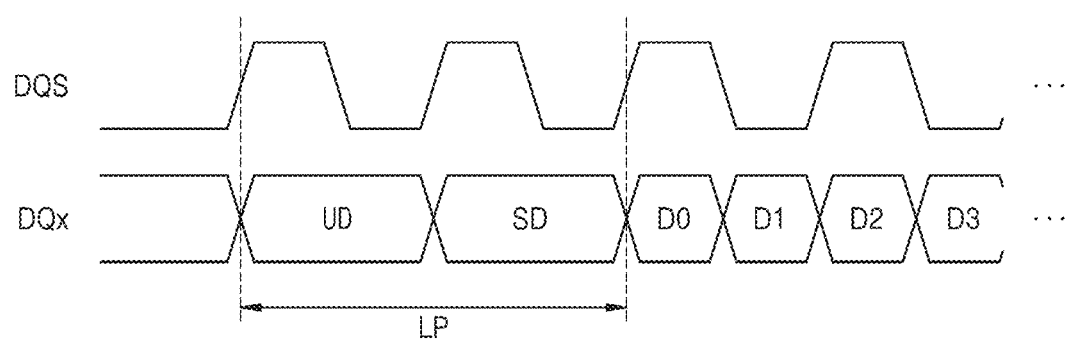
FIG. 7 is a timing diagram illustrating a method performed by a memory device of transmitting status data, according to an example embodiment of the inventive concepts.

FIG. 7 is a timing diagram illustrating a method performed by a memory device of transmitting the status data SD according to an example embodiment of the inventive concepts. It is assumed that a latency cycle in the latency period LP in FIG. 7 is 2.

Referring to FIG. 7, the memory device 120 may transmit the data signal DQx including undefined data UD to the memory controller 110 before the status data SD in the latency period LP. Because there is a concern that the data strobe signal DQS does not satisfy a target duty ratio in the latency period LP and is not recognized as a pulse signal by the memory controller 110, the memory device 120 may transmit the undefined data UD in an initial period of the latency period LP and then transmit the status data SD.

The method of transmitting the status data SD in FIG. 7 is merely an example embodiment, and is not limited thereto. A transmission period of the undefined data UD may change according to the length of the latency period LP, an operating environment of the memory device, the type of the status data SD, etc. The memory controller 110 may confirm the transmission period of the undefined data UD transmitted by the memory device 120 with reference to set feature information.

Figure 8A:
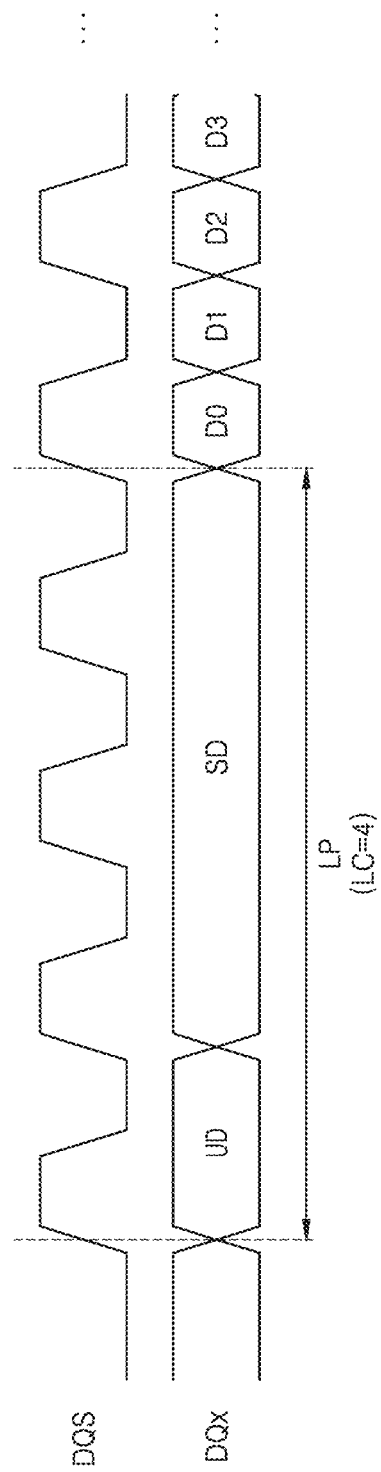
FIGS. 8A and 8B are timing diagrams for describing a method performed by a memory device of transmitting status data, according to an example embodiment of the inventive concepts.
Figure 8B:
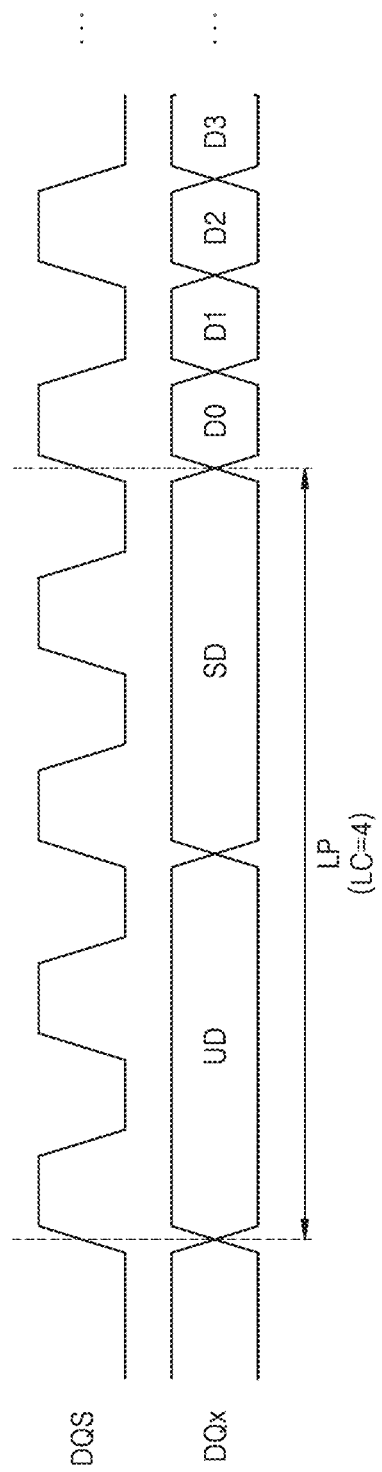

FIGS. 8A and 8B are timing diagrams for describing a method performed by a memory device of transmitting the status data SD according to an example embodiment of the inventive concepts. It is assumed that a latency cycle LC in the latency period LP in FIGS. 8A and 8B is 4.

Referring to FIG. 8A, the memory device 120 may transmit the data signal DQx including the undefined data UD to the memory controller 110 before the status data SD in the latency period LP. In an example embodiment, the memory device 120 may transmit the undefined data UD and the status data SD to the memory controller 110 during periods of different lengths in the latency period LP. For example, a period in which the undefined data UD is transmitted in the latency period LP may be shorter than a period in which the status data SD is transmitted. Specifically, the memory device 120 may transmit the undefined data UD to the memory controller 110 for one cycle of the data strobe signal DQS and subsequently transmit the status data SD to the memory controller 110 for three cycles of the data strobe signal DQS in the latency period LP. However, this is only an example embodiment, and the inventive concepts are not limited thereto. The period in which the undefined data UD is transmitted in the latency period LP may be longer than the period in which the status data SD is transmitted. That is, the period in which the undefined data UD is transmitted and the period in which the status data SD is transmitted according to an example embodiment of the inventive concepts may vary according to an operating environment of the memory device 120 that influences a duty ratio of the data strobe signal DQS in the latency period LP.

Referring to FIG. 8B, unlike FIG. 8A, the memory device 120 may transmit the undefined data UD and the status data SD to the memory controller 110 during a period of the same length in the latency period LP. Specifically, the memory device 120 may transmit the undefined data UD to the memory controller 110 for two cycles of the data strobe signal DQS and subsequently transmit the status data SD to the memory controller 110 for two cycles of the data strobe signal DQS in the latency period LP. However, this is only an example embodiment, and the inventive concepts are not limited thereto. The length of the transmission period of each of the undefined data UD and the status data SD may change according to the latency cycle LC.

Figure 9A:
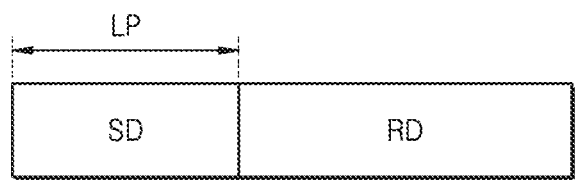
FIGS. 9A to 9C are diagrams illustrating a configuration of a data signal transmitted by a memory device to a memory controller through a data line according to example embodiments of the inventive concepts.
Figure 9B:
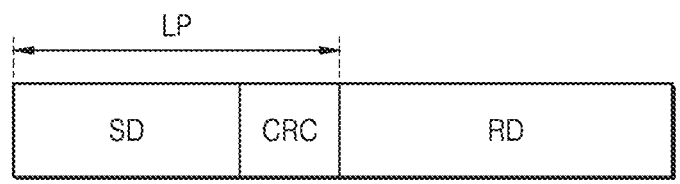
Figure 9C:
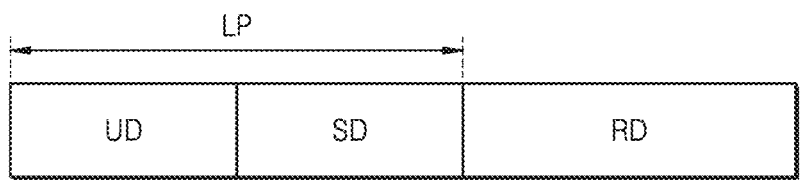

FIGS. 9A to 9C are diagrams illustrating a configuration of a data signal transmitted by a memory device to a memory controller through a data line according to example embodiments of the inventive concepts.

Referring to FIG. 9A, the data signal may include the status data SD transmitted in the latency period LP and the read data RD transmitted in a period subsequent to the latency period LP. The transmission rate of the status data SD according to an example embodiment may be the same as or similar to the transmission rate of the read data RD. According to some example embodiments, the transmission rate of the status data SD may be different from the transmission rate of the read data RD. Specifically, the transmission rate of the status data SD may be lower than the transmission rate of the read data RD, and the memory controller 110 may sample the status data SD at a lower frequency than the read data RD to obtain the status data SD.

Referring further to FIG. 9B, the data signal may include the status data SD transmitted in the latency period LP, a cyclic redundancy check (CRC) code CRC for increasing the reliability of the status data SD and the read data RD transmitted in the period subsequent to the latency period LP. The CRC code CRC may be used to check and correct an error of the status data SD in the memory controller 110 and, according to some example embodiments, may be replaced with a gray code.

Referring further to FIG. 9C, the data signal may include the undefined data UD transmitted in the latency period LP, the status data SD, and the read data RD transmitted in the period subsequent to the latency period LP. The memory controller 110 may skip the undefined data UD and obtain the sample and obtain the status data SD.

The configuration of the data signal illustrated in FIGS. 9A to 9C may be determined by the memory controller 110 and the memory device 120 through set feature information, and the memory controller 110 may obtain the status data SD received from the memory device 120 during the latency period LP based on the set feature information and control the memory device 120 (e.g., control a retraining operation on the memory device 120) based on the status data SD.

Figure 10:
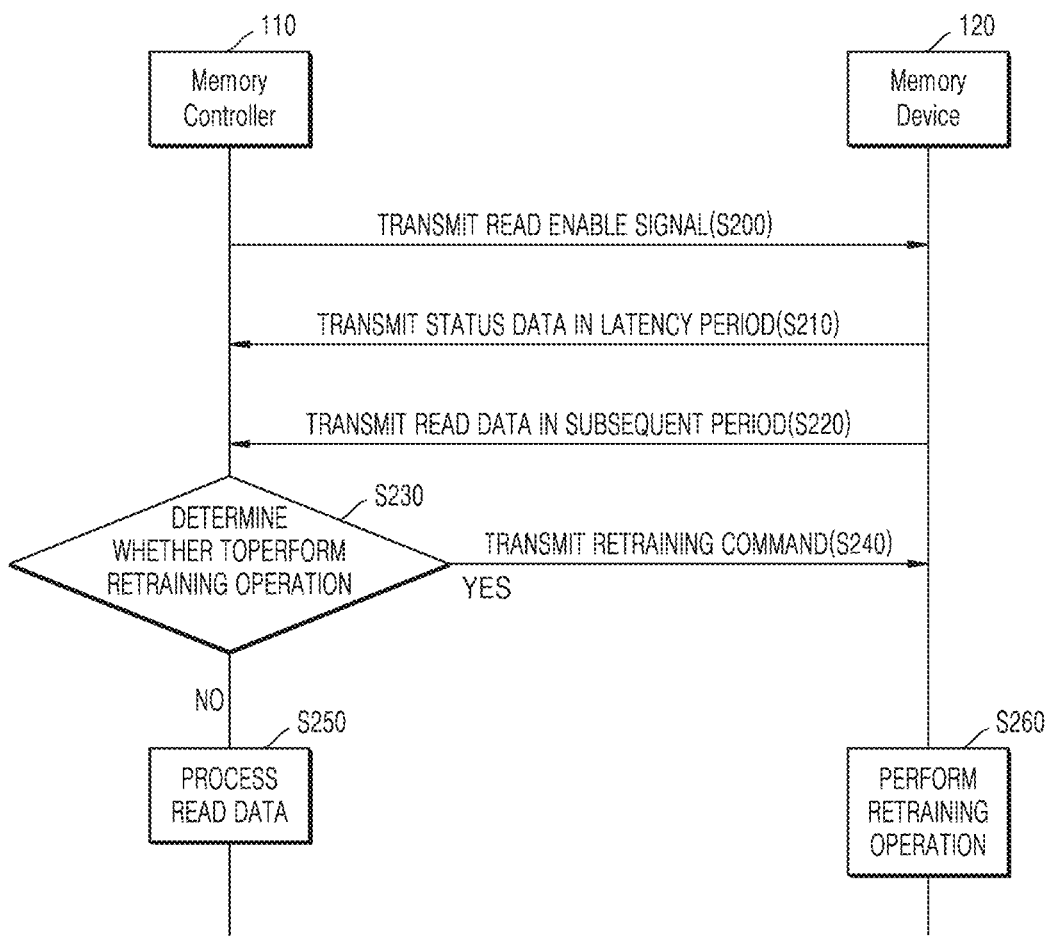
FIG. 10 is a flowchart illustrating an operation of a memory system according to an example embodiment of the inventive concepts.

FIG. 10 is a flowchart illustrating an operation of a memory system according to an example embodiment of the inventive concepts.

Referring to FIG. 10, in operation S200, the memory controller 110 may transmit a read enable signal to the memory device 120 so as to obtain read data.

In operation S210, the memory device 120 may generate a data strobe signal in response to the read enable signal to transmit the data strobe signal to the memory controller 110 through a data strobe line and transmit the status data to the memory controller 110 through a data line in a desired (or, alternatively, a predetermined) latency period.

In operation S220, the memory device 120 may transmit the read data to the memory controller 110 through the data line in a subsequent period of the latency period.

In operation S230, the memory controller 110 may determine whether to perform a retraining operation on the memory device 120 based on the status data. When it is determined that the retraining operation is to be performed (S230, YES), operation S240 may follow. Otherwise, when it is determined that the retraining operation is not to be performed (S230, NO), operation S250 may follow.

In operation S240, the memory controller 110 may transmit a desired (or, alternatively, a predetermined) command for performing the retraining operation to the memory device 120.

In operation S260, the memory device 120 may perform the retraining operation in response to the received command.

In contrast when it is determined that the retraining operation is not to be performed, in operation S250, the memory controller 110 may perform a processing operation on the read data of the memory device 120 and then transmit the processed read data to a host.

Figure 11A:
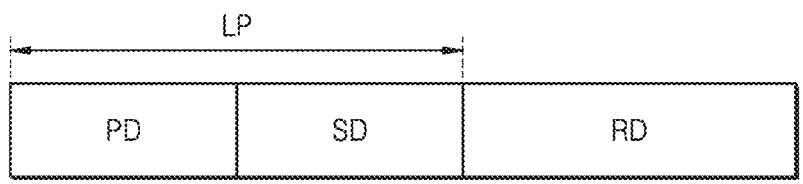
FIG. 11A is a diagram illustrating a configuration of a data signal transmitted by a memory device to a memory controller through a data line according to an example embodiment of the inventive concepts.
Figure 11B:
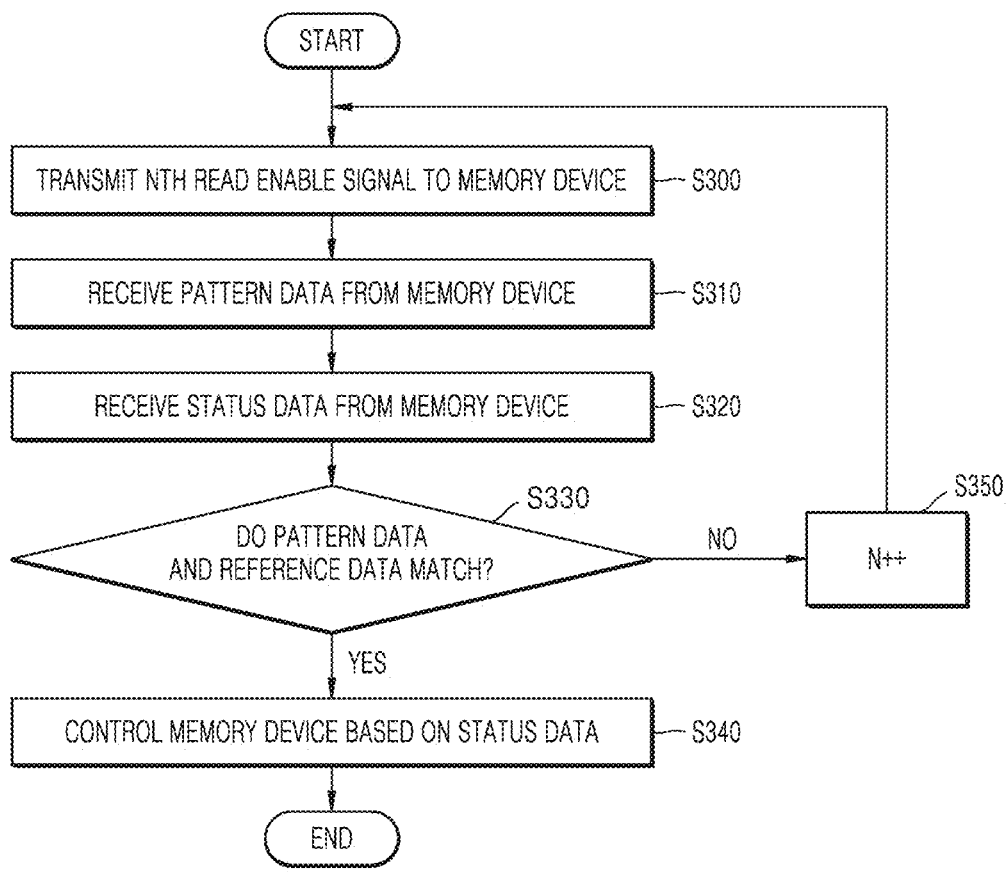
FIG. 11B is a flowchart illustrating a method of operating a memory system that determines validity of status data using the configuration of the data signal according to an example embodiment of the inventive concepts.

FIG. 11A is a diagram illustrating a configuration of a data signal transmitted by a memory device to a memory controller through a data line according to an example embodiment of the inventive concepts. FIG. 11B is a flowchart illustrating a method of operating a memory system that determines validity of the status data SD using the configuration of the data signal.

Referring to FIG. 11A, the data signal may include pattern data PD transmitted in the latency period LP, the status data SD, and the read data RD transmitted in a period subsequent to the latency period LP. The pattern data PD may be defined as data having a desired (or, alternatively, a predetermined) pattern in order to determine the validity of the status data SD. As described above, a data strobe signal in the latency period LP may have an unstable pulse, and thus, the validity of the status data SD transmitted in the latency period LP may be determined using the pattern data PD.

Referring further to FIG. 11B, in operation S300, the memory controller 110 may transmit an Nth (where N is an integer of 1 or more) read enable signal to the memory device 120.

In operation S310, the memory controller 110 may receive the pattern data PD from the memory device 120 in an initial period of the latency period LP.

In operation S320, the memory controller 110 may receive the status data SD subsequent to the pattern data PD from the memory device 120 in the latency period LP.

In operation S330, the memory controller 110 may determine whether the pattern data PD and reference data that is previously stored in the memory controller 110 match. When the pattern data PD and the reference data match (S330, YES), operation S340 may follow, and when the pattern data PD and the reference data do not match (S330, NO), operation S350 may follow.

In operation S340, the memory controller 110 may confirm the validity of the status data SD and control the memory device 120 based on the status data SD.

In operation S350, the memory controller 110 may confirm that the status data SD is not valid, skip sampling the received status data SD, and then transmit a read enable signal for a next read operation to the memory device.

Figure 12:
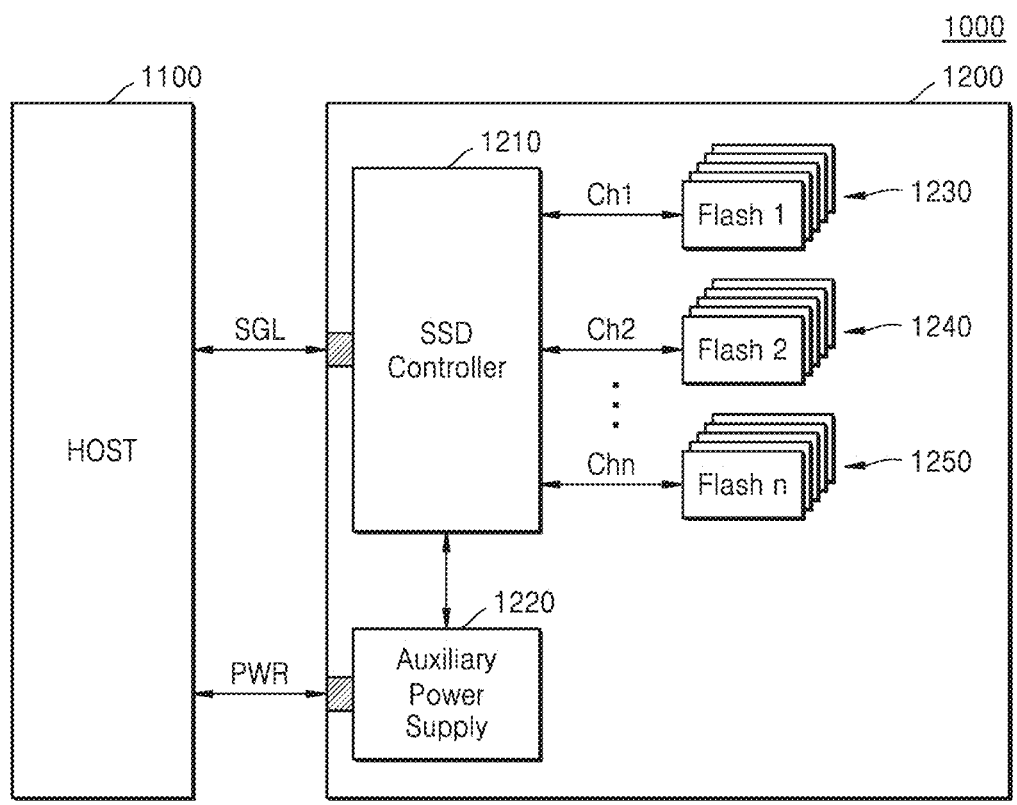
FIG. 12 is a block diagram illustrating a solid state drive (SSD) system according to an example embodiment of the inventive concepts.

FIG. 12 is a block diagram illustrating a solid state drive (SSD) system 1000 according to an example embodiment of the inventive concepts.

Referring to FIG. 12, the SSD system 1000 may include a host 1100 and an SSD 1200. The SSD 1200 exchanges signals with the host 1100 through a signal connector and receives power through a power connector. The SSD 1200 may include an SSD controller 1210, an auxiliary power supply 1220, and a plurality of memory devices 1230, 1240, and 1250.

The plurality of memory devices 1230, 1240, and 1250 according to example embodiments of the inventive concepts may transmit status data to the SSD controller 1210 through channels Ch1, Ch2, and Chn in response to a read enable signal received from the SSD controller 1210 in a latency period. The plurality of memory devices 1230, 1240, and 1250 may transmit read data through the channels Ch1, Ch2, and Chn in a period subsequent to the latency period. The SSD controller 1210 may determine whether to perform a retraining operation on the plurality of memory devices 1230, 1240, and 1250 based on the received status data. As described above, a method of transmitting the status data in the latency period may vary and may be previously promised between the SSD controller 1210 and the plurality of memory devices 1230, 1240, and 1250. In some example embodiments, the SSD controller 1210 may transmit the status data received from the memory devices 1230, 1240, and 1250 to the host 1100, and the host 1100 may perform the retraining operation on the plurality of memory devices 1230, 1240, and 1250 based on the status data through the memory controller 1210.

Figure 13:
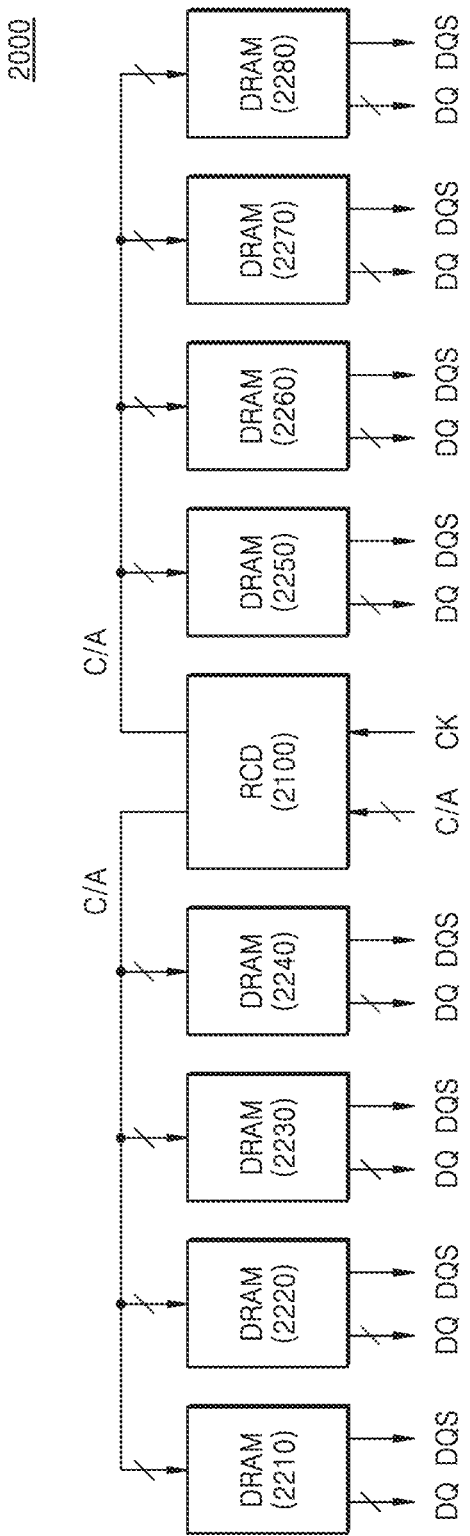
FIG. 13 is a block diagram illustrating a memory module to which a memory device is applied according to an example embodiment of the inventive concepts.

FIG. 13 is a block diagram illustrating a memory module 2000 to which a memory device is applied according to an example embodiment of the inventive concepts.

Referring to FIG. 13, the memory module 2000 may include a register clock driver (RCD) 2100 and a plurality of DRAM devices 2210 to 2280. The RCD 2100 may receive a command/address C/A and the clock signal CK from an external device (e.g., a host or a memory controller). The RCD 2100 may transfer the command/address C/A to the plurality of DRAM devices 2210 to 2280 based on received signals. Each of the DRAM devices 2210 to 2280 may output the plurality of data signals DQ and the data strobe signal DQS. For example, the plurality of DRAM devices 2210 to 2280 may output the data signals DQ including the status data indicating a state of each of the DRAM devices 2210 to 2280 in a desired (or, alternatively, predetermined) latency period as described with reference to FIGS. 1 to 11B.

The plurality of DRAM devices 2210 to 2280 may transmit the status data and user data to the external device (e.g., the host or the memory controller) through the plurality of data signals DQ based on the data strobe signal DQS. Thereafter, the external device may determine whether to perform a retraining operation on the DRAM devices 2210 to 2280 based on the status data received from the DRAM devices 2210 to 2280. As described above, a method of transmitting the status data in the latency period may vary and may be previously determined between the external device and the plurality of DRAM devices 2210 to 2280.

The memory controller 110 and the memory device 120 and the sub-components thereof including the enable signal generator 111, the status data generating circuit 121, data output circuits 123, 124, control logic 125 and DQS generator 129 may include processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc. Further the MCA 127 and the latch circuits LAT1-LATn may include non-volatile or volatile memory. The processing circuitry may be special purpose processing circuitry such that the memory device 120 uses the latency period when transmitting the status data, thereby effectively providing the status data without a separate command and a separate section, and the memory controller 110 determines whether to perform the retraining operation on the memory device 120 based on the status data. Therefore, the special purpose processing circuitry may improve the performance of the memory system 100 overall.

While example embodiments of the inventive concepts have been particularly shown and described with reference to example embodiments thereof, it will be understood that various changes in form and details may be made therein without departing from the spirit and scope of the following claims.

What is claimed is:
1. A memory device, comprising:
a memory cell array configured to store data; and
a data output circuit configured to,
 transmit status data to an external device through at least one data line during a latency period in response to a read enable signal received from the external device, and
 transmit the data stored in the memory cell array to the external device through the at least one data line during a period subsequent to the latency period.

2. The memory device of claim 1, wherein the latency period is from a first transition time of a data strobe signal subsequent to the read enable signal to a time when a set number of cycles of the data strobe signal occurs.

3. The memory device of claim 2, wherein transmission parameters associated with transmitting the status data is determined according to the set number of cycles.

4. The memory device of claim 3, wherein the transmission parameters associated with transmitting the status data includes at least one of a transmission start timing of the status data, a transfer rate of the status data, and a data type included in the status data.

5. The memory device of claim 1, wherein the status data includes data for determining whether to perform a retraining operation on the memory device.

6. The memory device of claim 1, wherein the data output circuit is configured to transmit undefined data to the external device through the at least one data line prior to transmission of the status data during the latency period.

7. The memory device of claim 1, wherein the data output circuit is configured to transmit, during the latency period, both pattern data used to determine a reliability of the status data and the status data such that, during the latency period, the pattern data is transmitted prior to transmitting the status data.

8. The memory device of claim 1, wherein the memory device is configured to transmit the status data at a data transmission rate lower than the data stored in the memory cell array.

9. The memory device of claim 1, wherein the at least one data line includes a plurality of data lines such that the data output circuit is configured to transmit different ones of the status data through respective ones of the plurality of data lines during the latency period.

10. The memory device of claim 1, wherein the at least one data line includes a plurality of data lines such that the data output circuit is configured to transmit a same one of the status data to the external device through the plurality of data lines during the latency period.

11. The memory device of claim 1, wherein the data output circuit is configured to transmit the status data based on set feature information determined for communication between the external device and the memory device.

12. A memory system comprising:
a memory controller; and
a memory device configured to,
 transmit status data to the memory controller through a plurality of data lines during a latency period in response to a read enable signal received from the memory controller, and
 transmit data stored in the memory device to the memory controller through the plurality of data lines during a period subsequent to the latency period.

13. The memory system of claim 12, wherein the memory controller is configured to determine whether to perform a retraining operation on the memory device based on the status data, and to control the memory device based on whether the memory controller determines to perform the retraining operation.

14. The memory system of claim 12, wherein the memory controller is configured to transfer the status data to a host, and to control a retraining operation of the memory device in response to a request to retrain the memory device from the host.

15. The memory system of claim 12, wherein the memory device is configured to generate the status data such that the status data includes retraining data indicating whether to periodically perform a retraining operation, and to store the retraining data in a memory space.

16. The memory system of claim 12, wherein the status data indicates a degree of change in a temperature environment or an operating voltage environment of the memory device.

17. The memory system of claim 12, wherein the memory device is configured to determine parameters associated with transmitting the status data based on set feature information determined for communication between the memory controller and the memory device.

18. The memory system of claim 12, wherein the memory device is configured to transmit the status data at a first data transmission rate and the data stored in the memory device at a second data transmission rate, the first data transmission rate being different from the second data transmission rate.

19. A memory device comprising:
a memory cell array configured to store first data and second data; and
a data output circuit configured to,
  transmit the first data to an external device at a first transmission rate through a plurality of data lines during a latency period in response to a read enable signal received from the external device, and
  transmit the second data to the external device at a second transmission rate through the plurality of data lines in a period subsequent to the latency period.

20. The memory device of claim 19, wherein
the first data includes data for determining whether to perform a retraining operation on the memory device, and
the second data includes user data.

\* \* \* \* \*